US005497097A

United States Patent [19]

Walling et al.

[11] Patent Number: 5,497,097

[45] Date of Patent: Mar. 5, 1996

[54] APPARATUS FOR DETECTING A CONNECTION BETWEEN ADJACENT PANELS OF A CURTAIN WALL

[75] Inventors: Walter W. Walling; Patrick T. Brunette, both of Conroe, Tex.

[73] Assignee: GSE Lining Technology, Inc., Houston, Tex.

[21] Appl. No.: 235,939

[22] Filed: May 2, 1994

[51] Int. Cl.[6] .................... G01R 31/02

[52] U.S. Cl. .................... 324/555; 324/538; 324/713; 340/687; 439/289

[58] Field of Search .................... 324/500, 537, 324/538, 555, 713, 715, 718; 439/289; 340/500, 686, 687

[56] References Cited

U.S. PATENT DOCUMENTS

| | | | |
|---|---|---|---|
| 3,611,261 | 10/1971 | Gregory | 340/687 X |
| 5,179,343 | 1/1993 | Chishima | 340/687 X |
| 5,373,286 | 12/1994 | Osbourne | 340/687 X |

*Primary Examiner*—Kenneth A. Wieder
*Assistant Examiner*—Diep Do

[57] ABSTRACT

An apparatus for detecting a connection between adjacent vertical panels having a first contact element positioned adjacent a bottom of one of the panels, a second contact element positioned adjacent a bottom of an adjacent panel, a first conductive line extending from the first contact element, a second conductive line extending from the second contact element, an electrical source for passing a current to at least one of the first and second conductive lines, and a detector connected to one of the first and second conductive lines for ascertaining the existence of a connection between the first contact element and the second contact element. The second contact element is positioned in proximity to the first contact element when the panels are connected together. The first contact element is affixed to a connector member of the panel. The second contact element is affixed in a channel of an adjacent panel. The connector member is a T-shaped member. The channel is formed in an interlocking connector of the adjacent panel. The T-shaped member is slidably received within the channel.

18 Claims, 3 Drawing Sheets

APPARATUS FOR DETECTING A CONNECTION BETWEEN ADJACENT PANELS OF A CURTAIN WALL

TECHNICAL FIELD

The present invention relates to geomembrane panels generally. More particularly, the present invention relates to interlocking connectors as used on such geomembrane panels. Specifically, the present invention relates to devices used for the determination of a connection between interlocking. connectors on geomembrane panels.

BACKGROUND ART

Curtain walls (or cut-off walls as they are sometimes called) are extensively used as a means of separating sources of contaminated liquids or gases from the environment. In their simplest form, curtain walls consist of a trench into which some type of impermeable material is placed to form a barrier or restriction to lateral fluid flow. The trench is desirably of sufficient depth to reach impermeable strata, thus providing a complete seal against egress of contaminants.

Various media have been used to form the barrier, including materials such as clay and bentonite. More recently, synthetic membranes, notably high density polyethylene, have been used for this purpose. The choice of high density polyethylene is based on its unique composition of properties of high mechanical strength, deformability, corrosion resistance, resistance to biological attack, impermeability to leachate and landfill gas, and extended service life due to its very high resistance to cracking.

High density polyethylene membranes, which are one type of membrane commonly used in cut-off wall applications, are usually of a minimum thickness of 2.0 mm to provide sufficient mechanical strength to absorb forces encountered both in installation and in operation, to contain resulting strains within acceptable limits, and to provide a service life consistent with the design purpose. Depending on the materials used to backfill the cut-off trench, additional protection for the membrane in the form of a geotextile or similar material may be required. Other thicknesses and/or types of membrane may be useful for particular applications. The membrane may be the principal barrier or a component of a multiple barrier system. Where bentonite is used in the exacavation of the trench, this material also provides adequate protection for the membrane as well as an additional barrier against fluid migration.

In certain circumstances, such as short, straight, and shallow cut-off trenches, it may be possible to install the membrane as a single section. However, in most cases, depth or instability of the subgrade and other factors may limit the amount of trench which can be open and unobstructed at any time and in consequence require that the membrane is installed in a series of panels which must be joined together within the trench. Other than in cases of broad, open, dry trenches where there is safe access for welding, some form of mechanical interlock must be introduced to allow membrane panels of the appropriate width and depth to be installed consecutively with a joint which has a permeability consistent with the design objectives of the project.

In normal application, a large number of such curtain wall panels are used for filling the length of the trench. When a large number of panels are used, it is necessary that the edges of the panels be joined together so as to form a continuous barrier against the penetration of liquid. In all applications in which it is necessary to join the edge of one panel to the edge of another panel, interlocking connectors are employed. It is typically the goal of such interlocking connectors to be able to quickly and easily join the edges of the panels together while, at the same time, providing a liquid-tight barrier against the intrusion of liquids between the curtain wall panels.

In the past, one type of interlocking connector assembly has been of a type shown in FIG. 1. In FIG. 1, it can be seen that the interlocking connector 10 is fastened to the membrane 12. Typically, the interlocking connector 10 is formed separately from the membrane portion of the panel 12. The interlocking connector 10 is joined to the panel by various techniques. The interlocking connector 10 includes a backing surface 14 which extends outwardly from the edge 16 of membrane 2. T-shaped members 18, 20, and 22 extend outwardly from the backing surface 14. Each of the T-shaped members 18, 20, and 22 is arranged in generally a parallel relationship to each other. A channel 24 is formed in the area between the first T-shaped member 18 and the second T-shaped member 20. A channel 26 is formed in the area between the second T-shaped member 20 and the third T-shaped member 22. Additionally, an L-shaped member 28 is formed so as to extend outwardly from the backing surface 14 in an area generally adjacent to the edge 16 of the interlocking connector 10. L-shaped member 28 has a portion extending inwardly so as to define channel 30 with the third T-shaped member 22. T-shaped members 18, 20, and 22 define a slotted opening 32 therebetween. Additionally, a slotted opening 34 is defined between the third T-shaped member 22 and the L-shaped member 28. The channels 24, 26, and 30, in combination with the slotted openings 32 and 34 serve to provide the "interlocking" mechanism of the prior art interlocking connector.

In FIG. 1, it can be seen how a second geomembrane panel 36 is joined to the interlocking connector 10 of geomembrane panel. The geomembrane panel 36 includes a panel 38 which is joined at its edge 40 to an interlocking connector 42. Interlocking connector 42 has a configuration identical to the configuration of the interlocking connector 10. The interlocking connector 42, however, faces in a different direction than that of the interlocking connector 10 so as to allow for the joining of the members. The interlocking connector 42 includes a backing surface 44. An L-shaped member 46 extends outwardly from this backing surface 44. Additionally, T-shaped members 48, 50 and 52 also are formed so as to extend outwardly of the backing surface 44. It can be seen that the T-shaped member 48 is received within channel 24, the T-shaped member 50 is received within channel 26, and the T-shaped member 52 is received within channel 30. The T-shaped members 48 and 50 extend through slotted openings 32. The T-shaped member 52 extends through slotted opening 34. In normal installation techniques, the interlocking connector 42 of the second geomembrane panel 36 will simply slide through the channels of the first interlocking connector 10.

Various sealing mechanisms may be employed after the panels are connected. One type of sealing arrangement is shown in FIG. 1. In FIG. 1, a high-density polyethylene tube 56 is inserted into one or more of the channels of the interlock. The tube 56 may be left open or, alternatively, filled with a liquid grout or with water in applications where forces acting on the interlock may require additional support for the seal tube 56.

In FIG. 1, it can also be seen that a polyethylene tube 58 is installed in the area between the first T-shaped member 18 of the interlocking connector 10 and the T-shaped member 48 of the interlocking connector 42. A polyethylene tube 60 is inserted so as to extend between the T-shaped member 50 of the second interlocking connector 42 and the T-shaped member 22 of the first interlocking connector 10. Finally, another polyethylene tube 62 is inserted into the area of channel 30 between the T-shaped member 52 of the second interlocking connector and the T-shaped member 22 of the first interlocking connector 10. Each of these polyethylene tubes are inserted so as to establish a rather "tight" fit between the T-shaped members within each of the channels.

During installation of the curtain wall system in the earth, it is necessary for the interlocking connectors to be joined together in an interlocking fashion. Conventionally, with reference to FIG. 2, the interlocking connector 92 will simply slide through the openings in the interlocking connector 84 of the panel 82. Similarly, the interlocking connector 94 of the adjacent panel will slide through the openings of the second interlocking connector 88 of panel 82. It is important in the installation of the curtain walls that these curtain walls provide a proper barrier against the passage of liquids from one side to the other side. The integrity of the curtain wall as a proper barrier is compromised if the interlocking connectors are not properly joined. As such, it has been necessary to assure purchasers of the curtain wall system that a complete connection has been made between each of the interlocking connectors. This is often a problem when interlocking connectors (of designs other than that shown in FIGS. 1 and 2) are used in the formation of the curtain wall system.

Many other types of interlocking connectors will have a tendency to distort or to pull apart during the installation of the vertical panels in the curtain wall system. Some interlocking connectors, of other designs, will tend to separate upon the great forces that are placed upon them during the installation of one panel adjacent another panel. Whenever the panels pull apart along the length of the interlocking connector, then the integrity of the panel system has been compromised. As such, it is very important to assure that the proper interlocking connection has been achieved throughout the entire length of the panel. Also, it is often necessary to prove that the connection has been established after the panels have been placed into the earth.

It is an object of the present invention to provide an apparatus for detecting a connection between adjacent vertical panels of a curtain wall system.

It is another object of the present invention to provide a device for assuring the integrity of an interlocking connection of vertical panels.

It is a further object of the present invention to provide a device for proving the connection of panels which is easy to use, simple to install, and relatively inexpensive.

These and other other objects and advantages of the present invention will become apparent from a reading of the attached specification and appended claims.

SUMMARY OF THE INVENTION

The present invention is a device for detecting a connection between adjacent vertical panels that comprises a first contact element positioned on a connector of one of the panels, a second contact element positioned on an interlocking member of an adjacent panel, a first conductive line connected to the first contact element and extending upwardly therefrom, a second conductive line connected to the second contact element and extending upwardly therefrom, a means for passing a current to at least one of the first and second conductive lines, and a means for detecting a current in one of the first and second conductive lines. The interlocking member receives the connector. The second contact element is positioned in proximity to the first contact element when the connector is received by the interlocking member.

Each of the panels has a top edge and a bottom edge. The first and second contact elements are positioned adjacent to the bottom edge of the panels. The first and second conductive lines extend above the top edge. The first conductive line extends along the connector. The second conductive line extends along the interlocking member of the adjacent panel. Specifically, the connector is a T-shaped member extending outwardly from a surface of the panel. The first contact element is affixed to an outer surface of the T-shaped member. The interlocking member is a channel which is formed in the adjacent panel. The T-shaped member is slidably received within this channel. The second contact element is affixed to a surface of the adjacent panel within the channel.

The contact element is a conductive member having an outer surface. The first conductive line is connected to the outer surface of the contact element. The conductive member is mechanically affixed to the T-shaped member.

The first conductive line may have a plurality of contact elements positioned at spaced locations along the connector. Similarly, or alternatively, the second conductive line may have a plurality of contact elements positioned at spaced locations along the interlocking member. The first conductive line may be integrally formed with the connector and the second conductive line be integrally formed with the interlocking member.

The means for passing a current is a source of direct current, such as a battery. The means for detecting serves to measure resistance in the conductive lines.

DETAILED DESCRIPTION OF THE INVENTION

Figure 1:
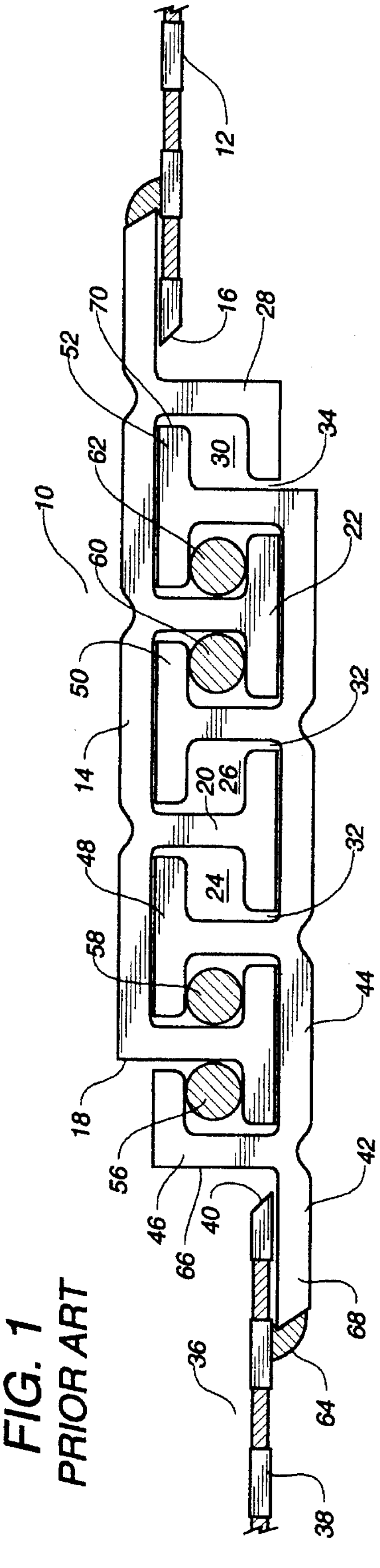
FIG. 1 PRIOR ART
FIG. 1 is a top plan view showing the arrangement of interlocking connectors as used on a prior art curtain wall system.
Figure 2:
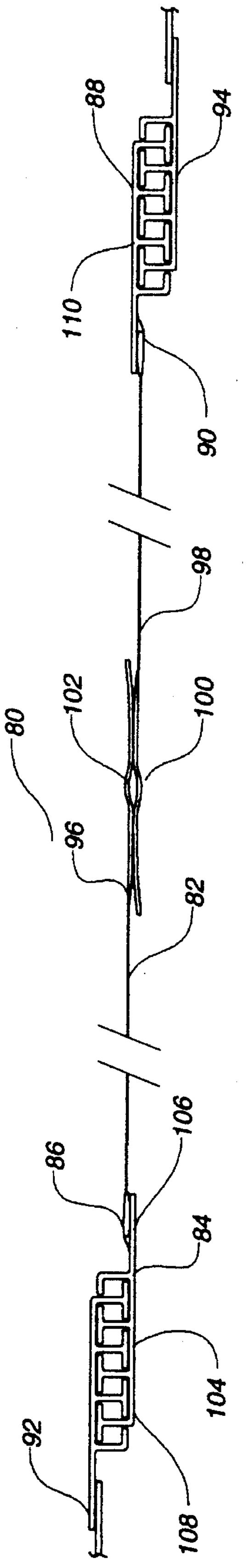
FIG. 2 PRIOR ART
FIG. 2 is a top plan view of one type of geomembrane panel assembly as used for the creation of a curtain wall.

Referring to FIG. 2, there is shown at 80 a geomembrane panel assembly in accordance with the prior art. Geomembrane panel assembly 80 includes a panel 82 having a first interlocking connector 84 at one edge and another interlocking connector 88 at an opposite edge. The interlocking connector 84 is joined to a complementary interlocking connector 92 of an adjacent panel. Similarly, the second interlocking connector 88 is joined to a complementary interlocking connector 94 of an adjacent panel. In the manner illustrated in FIG. 2, the panel 82 can be joined in an assembly of geomembrane panels for the purpose of creating a curtain wall in the earth.

In FIG. 2, it can be seen that the panel 82 is made up of a first panel section 96 and a second panel section 98. The first panel section 96 is joined to the second panel section 98 by shop fusion welds in the area of the overlap between the panel sections 96 and 98. These panels can be joined together so as to create a barrier in the earth. An air test channel 102 is formed in the area of the overlapping relationship 100 between the first panel section 96 and the second panel section 98. The air test channel 102 extends downwardly through the panel 82 so as to allow for testing of the integrity of the joinder of the panel sections 96 and 98.

The panel 82 is joined by a fusion weld 86 to the first interlocking connector 84. Similarly, the panel 82 is joined by a fusion weld 90 to the second interlocking connector 94.

Figure 3:
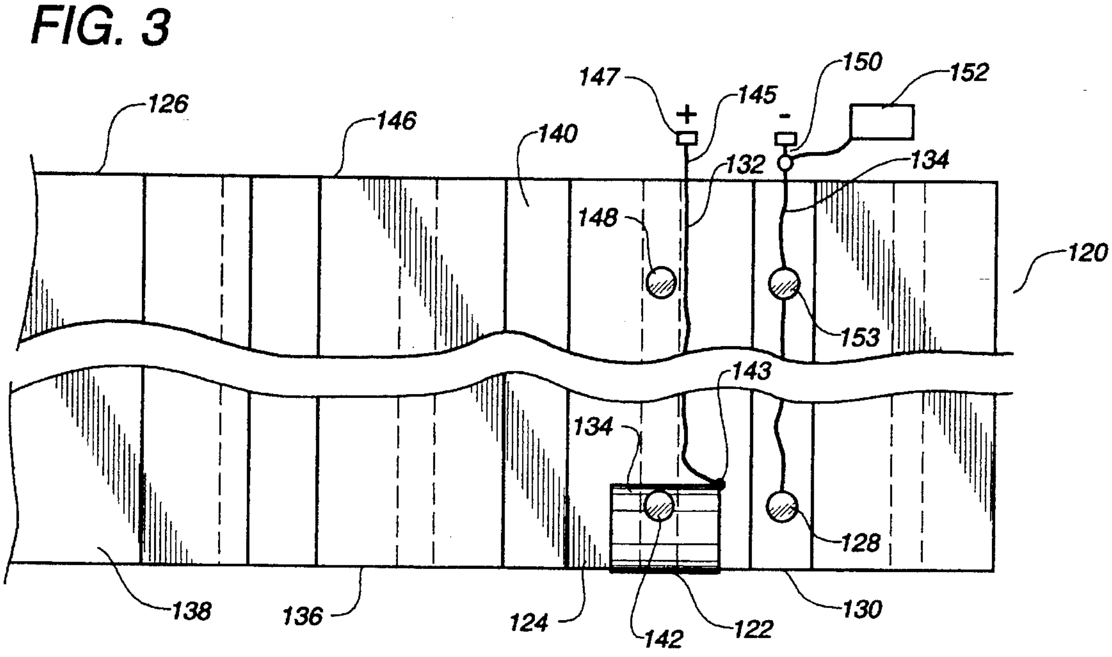
FIG. 3 is a side elevational view showing the present invention as applied to an interlocking connector of a geomembrane panel.

Referring to FIG. 3, there is shown at 120 the device for the detection of a connection between adjacent vertical panels in accordance with the preferred embodiment of the present invention. The device 120 comprises a first contact element 122 positioned on a connector member 124 of a panel assembly 126, a second contact element 128 positioned on a surface of a channel 130, a first conductive line 132 connected to the first contact element 122 and extending upwardly therefrom, and a second conductive line 134 connected to the second contact element 128 and extending upwardly therefrom. For the purposes of illustration, FIG. 3 illustrates the present invention as applied to a single interlocking connector 136 as affixed to a panel assembly 126. In the single interlocking connector 136, there is shown the first contact element 122 and the second contact element 128. It is important to realize that for the functioning of the present invention, the first contact element 122 will connect with a corresponding contact element as found on a surface of the channel of an interlocking connector of an adjoining panel assembly. Similarly, the second contact element 128 will connect with a corresponding contact element found on a surface of another connector member of the interlocking connector 136. In FIG. 3, the illustration actually shows two independent systems for the determination of a connection between adjacent vertical panels. The actual manner in which the contact elements 122 and 128 are used for the establishment and determination of the connection between the adjacent panels is illustrated, with more particularity, in FIG. 5.

In FIG. 3, it can be seen that the first contact element 122 is affixed adjacent a bottom edge 138 of the panel assembly 126. The first contact element is a conductive member having an outer surface 139. The outer surface 139 is positioned on an exterior surface of the connector member 124. As was described previously, the connector member 124 is a T-shaped member extending outwardly from the surface 140 of the interlocking connector 136 of the panel assembly 126. The contact element 122 is arranged in generally parallel relationship to the backing surface 140. The outer surface 139 of contact element 122 has a button area 142 formed thereon. The button area 142 will be the surface which is used to establish contact with the adjacent second contact element of an adjacent panel. The button area 142 may extend outwardly of the surface 139 or be flush with the surface. It is also possible, within the concept of the present invention that either the outer surface 139 or the button area 142 may be omitted. In an effort to establish a positive connection between the first contact element 122 and the second contact element, it is desirable that the outer surface 139 be spring tensioned so as to extend outwardly of the outer surface of the connector 124.

In FIG. 3, the first conductive line 132 is affixed at 143 to the outer surface 139 of the first contact element 122. This first conductive line 132 extends upwardly along the inner surface of the connector member 124. An end 145 of the first conductive line 132 extends outwardly above the top surface 146 of the panel assembly 126. The end of the first conductive line 145 can be connected to a source of electrical energy, such as a battery. As shown in FIG. 3, the end 145 of the first conductive line 132 is connected to a terminal of a battery 147. The battery 147 serves to pass a current to the first conductive line 132.

Within the concept of the present invention, it is important to realize that a plurality of first contact elements 122 may be positioned along the conductive line 132. As illustrated in FIG. 3, another first contact element 148 is positioned on an outer surface of the connector member 124 at a spaced location above the first contact element 122. The use of another contact element 148 can serve to establish continuous proof of the connection between the interlocking connectors of the curtain wall system. The use of a plurality of contact elements can serve to establish proof that the connection between the panels is continuous along the length of the interlocking connector.

It is also important to realize that the battery 147 can be replaced by any source of electric energy. It is not critical that the conductive line 132 be affixed to the terminal of the battery. It is only a requirement that some form of current be passed through the conductive line 132 and the contact element 122.

The second contact element 128 is positioned on a surface of the channel 130 of the interlocking connector 136. The channel 130 of the interlocking connector 136 is used to receive the T-shaped connector member 124. The second contact element 128 will be placed against the backing surface 140 of the interlocking connector 136. As can be seen, the second contact element 128 is positioned generally in proximity to and at the level of the first contact element 122. The second conductive line 134 is affixed to the second contact element 128 and extends upwardly therefrom along the backing surface 140 of the channel 130 of the interlocking connector 136. The end 150 of the second conductive line 134 extends outwardly above the top edge 146. The end 150 of the conductive line 134 can be connected to a source of electrical energy so that a current can be passed through the line 134. A detector 152 is affixed to the conductive line 134 so as to sense a current passing in the line 134. The detection of a current in the line 134 can be used to establish the existence of a connection between the first contact element and the second contact element (of an adjacent panel). Specifically, the detector 152 can measure the resistance in the line 134 so as to determine the connection between the adjacent panels.

It is also important to realize that in the system of the present invention, the detector 152 can also, or alternatively, be connected to the line 132. The end 150 of the second line 134 can be connected to a terminal of a battery or can be connected to another source of electrical energy. Furthermore, in FIG. 3, it can be seen that another contact element 153 is affixed along the conductive line 134 in spaced relationship to the contact element 128. The contact element 153 can be used so as to provide a proper determination of whether the panels are connected together continuously along the length of the interlocking connector 136.

Figure 4:
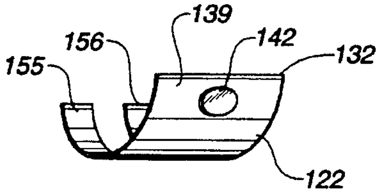
FIG. 4 is an isolated perspective view of the first contact element of the device of the present invention.

In FIG. 4, it can be seen that the first contact element 122 is illustrated in detailed fashion. The first contact element 122 is formed of a section of conductive metal. The first contact element 122 has a conductive surface 139 and arms 155 and 156 extending rearwardly therefrom. The arms 155 and 156 are positioned in spaced relationship so as to extend around the sides of the T-shaped member of the connector 124. These arms 155 and 156 can be bent so as to properly engage the T-shaped member so as to mechanically affix the first contact element 122 in a proper position. The use of a metal material as the contact element 122 can serve to establish a spring tensioned relationship of the outer surface 139 extending outwardly from the outer surface of the connector 124. The conductive button 142 can also be formed on the outer surface 139 so as to provide a direct area in which the contact element 122 can contact an adjacent second contact element 128. The first conductive line 132 is affixed to the outer surface 139 and extends upwardly and outwardly therefrom.

Figure 5:
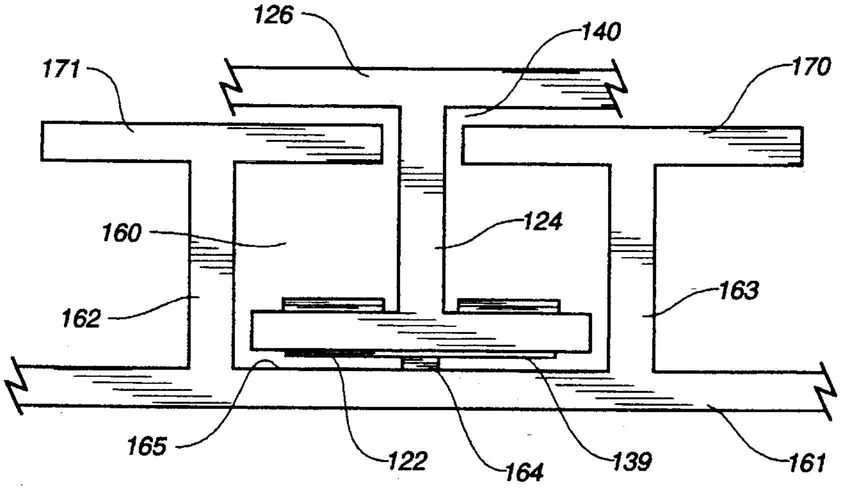
FIG. 5 is an enlarged plan view of the apparatus in accordance with the preferred embodiment of the present invention.

FIG. 5 specifically illustrates the operation of the present invention. In FIG. 5, the first contact element 122 is illustrated as affixed to the connector member 124. The connector member 124 is a T-shaped member which extends outwardly from the backing surface 140 of the interlocking connector. First contact element 122 has its outer surface 139 extending outwardly from the outer surface of the T-shaped connector member 124. The first contact element 122 is shown as joined within a channel 160 formed in an adjacent panel assembly 161. The channel 160 is specifically formed within the panel assembly 161 between the first T-shaped member 162 and the second T-shaped member 163. The T-shaped members 162 and 163 have a configuration similar to that of the T-shaped connector member 124. The arrangement of the T-shaped members 162 and 163 serve to define the channel 160 within the adjacent panel assembly 161. It can be seen that the connector member 124 is slidably received within the channel 160.

In FIG. 5, the corresponding contact element 164 is illustrated as positioned on a surface 165 of the adjacent panel assembly 161. Specifically, the corresponding contact element 164 is positioned within the channel 160 of the panel assembly 161. The corresponding contact element 164 is positioned in proximity to the outer surface 139 of the first contact element 122. When the connector member 124 is properly installed within the interlocking channel 160, then the outer surface 139 of the first contact element 122 will be in surface-to-surface contact (or very close proximity) to the corresponding contact element 164. When this contact is established, then the current flowing in the first contact element 122 and/or the corresponding contact element 164 will establish a circuit through the respective conductive lines extending to the top surface of the panel assemblies. The detector 152 will be used to determine the presence of a completed circuit, to determine the resistance in the respective conductive lines, or to establish the passage of a current through both of the conductive lines. As a result, the positioning of the first contact element 122 on the connector 124 and the corresponding contact element 164 within the interlocking member 160 can serve to establish positive proof of the continuous connection of the interlocking connectors of the panel assemblies 126 and 161. As used herein, the "corresponding contact element 164" of FIG. 5 has a configuration similar to that of the second contact element of FIG. 3.

With reference to FIG. 5, it should be kept in mind that the first contact element 122 could also be placed upon the end 170 of T-shaped member 163 and/or the end 171 of T-shaped member 162. Similarly, the contact element 164 can be placed on a location on the backing surface 140 corresponding to the location of the contact elements on the T-shaped members 162 and 163. The arrangement shown in FIG. 5 is simply for the purposes of, illustration. The configuration of the contact elements 122 and 164 can be arranged in various ways so as to allow for the determination of a connection between adjacent vertical panels in the curtain wall system.

Figure 6:
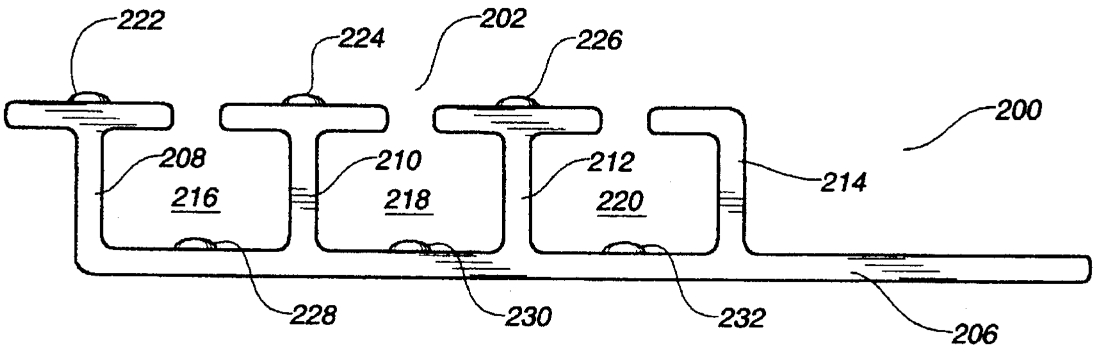
FIG. 6 is a top plan view of an alternative embodiment of the present invention.

FIG. 6 illustrates an alternative arrangement of the present invention. In FIG. 6, it can be seen that a single interlocking connector 200 is specifically illustrated. Interlocking connector 200 has T-shaped members 208, 210, and 212 extending outwardly from the backing surface 204. Backing surface 204 extends continuously into flap 206. Flap 206 may be bonded, welded, or otherwise attached to a geomembrane panel. The T-shaped members 208 and 210 are the connector members in accordance with the present invention. These T-shaped members define the area of the first channel 216 therebetween. Similarly, the connectors 210 and 212 define the area of the second channel 218. Finally, the T-shaped member 212 and an L-shaped member 214 define a third channel 220.

In the previous embodiment of the present invention, it was shown how the first contact element, the second contact element, and their respective conductive lines extend along a single connector member or along the length of a channel. In FIG. 6, it can be seen that the configuration of the present invention can be integrally formed with the interlocking connector 200 and can be formed along each of the connectors and on each of the channels. For example, the conductive line 222 is integrally formed on the end surface of the T-shaped member 208. The conductive line 224 is integrally formed on the end surface of the T-shaped member 210. The conductive line 226 is integrally formed on the end surface of the T-shaped member 212. Each of the conductive lines 222, 224, and 226 can be connected to a plurality of first contact elements extending along the length of the surface of each of the respective T-shaped members or they can be connected to a single contact element located at the bottom of the interlocking connector 200. The conductive lines 222, 224 and 226 can be insulated wires that are formed into the interlocking connector 200 during the extrusion process. The conductive lines 222, 224, and 226 can also be conductive plastic strips that are formed on the surfaces of the T-shaped members 208, 210, and 212, respectively.

A second conductive line 228 is formed centrally on the backing surface 204 in the area of the first channel 216 between the connectors 208 and 210. Similarly, the conductive line 230 is formed in the area of the second channel 218. Additionally, the conductive line 232 is formed in the area of the third channel 220. Each of the conductive lines 228, 230, and 232 is integrally formed on the backing surface 204. These conductive lines will be connected to the second contact elements positioned at the bottom of the interlocking connector 200 so as to be in proximity with the corresponding first contact elements on the end surfaces of connectors received within each of the channels 216, 218, and 220.

Figure 7:
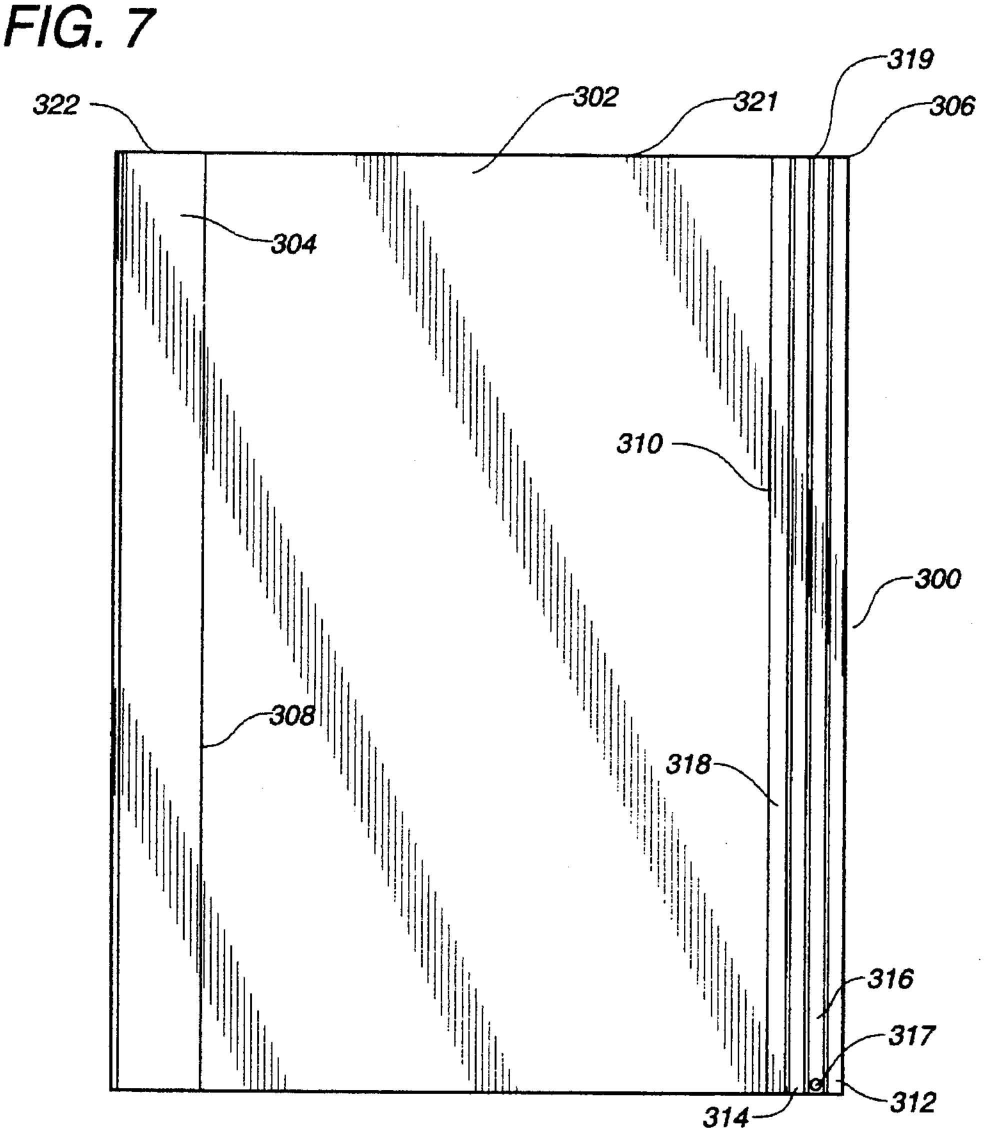
FIG. 7 is a full size elevational view of the geomembrane panel as used in accordance with the present invention.

FIG. 7 illustrates a single panel assembly 300. It can be seen that the panel assembly 300 includes the panel 302 and a first interlocking connector 304 and a second interlocking connector 306 at the ends 318 and 310, respectively. The interlocking connector 306 has T-shaped members 312, 314, and 316 extending outwardly therefrom. The first contact element 317 is positioned on a surface of the T-shaped member 316. The line 319 extends along the interior of the T-shaped member 316 and has an end extending outwardly above the top edge 321 of the panel 302.

The interlocking connector 304 shows a line 322 extending outwardly above a top edge 321 of the panel 302. The line 322 may be connected to a corresponding second contact element formed within the area of the channels (as described herein previously). The lines 319 and 322 can be properly connected to a detector and/or a source of electrical energy so as to allow for the determination of whether a circuit has been created by the installation of one connector within a channel.

The present invention facilitates the ability to prove the existence of a proper installation of one panel to an adjacent panel in a curtain wall assembly. Since the panels are conventionally installed in a deep trench formed in the earth, it is often difficult to ascertain, by visual observation, the complete connection of one connector within a channel. The present invention enables this determination by the establishment of an electrical contact between the contact elements formed at the ends of the panel. It can safely be said that if the panels are joined together at the very bottom, then the interlock is properly established throughout the entire length of the interlock connector. However, if there is no electrical connection established, then a determination can easily be made that the installation was improper. If leaking should occur between adjacent panels after installation and use, then the location of the leakage can be determined by testing if the electrical connection remains between the panels. As a result, the device of the present invention greatly facilitates the ability to determine the existence of a complete connection between adjacent vertical panels and the integrity of such a connection.

The foregoing disclosure-and description of the invention is illustrative and explanatory thereof. Various changes in the details of the illustrated configuration may be made within the scope of the appended claims without departing from the true spirit of the invention. The present invention should only be limited by the following claims and their legal equivalents.

We claim:

1. A device for detecting a connection between interlocking connectors of adjacent vertical panels, each of the interlocking connectors having a connector member and a channel formed therein, the device comprising:

- a first contact element positioned on the connector member of one of the panels;
- a second contact element affixed to a surface on the channel of the interlocking connector of the adjacent panel, said second contact element positioned in proximity to said first contact element when the connector member is received by the channel;
- a first conductive line connected to said first contact element and extending along a length of the connector member;
- a second conductive line connected to said second contact element and extending along a length of the channel;
- a means for passing a current to at least one of said first and second conductive lines; and
- a means for detecting a current in one of said first and second conductive lines.

2. The device of claim 1, the panels having a top edge and a bottom edge, said first and second contact elements positioned adjacent said bottom edge.

3. The device of claim 2, said first and second conductive lines extending above said top edge, said first conductive line extending along an entire length of said connector member.

4. The device of claim 1, said connector member being a T-shaped member, said first contact element affixed to an outer surface of said T-shaped member.

5. The device of claim 4, said contact element being a conductive member having an outer surface, said conductive member mechanically affixed to said T-shaped member.

6. The device of claim 1, said first conductive line having a plurality of additional contact elements positioned at spaced locations along said connector member.

7. The device of claim 1, said second conductive line having a plurality of additional contact elements positioned at spaced locations along the surface of the channel.

8. The device of claim 1, said first conductive line integrally formed onto the connector member, said second conductive line integrally formed onto the surface of the channel.

9. The device of claim 1, said means for passing a current being a source of direct current, said means for detecting for measuring resistance in the conductive lines.

10. An apparatus for detecting a connection between interlocking connectors of adjacent vertical panels, each of the interlocking connectors having a connector member and a channel, the apparatus comprising:

- a first contact element positioned adjacent a bottom of one of the interlocking connectors;
- a second contact element positioned adjacent a bottom of the interlocking connector of the adjacent panel, said second contact element positioned in proximity to said first contact element when the interlocking connectors are connected together;
- a first conductive line connected to said first contact element;
- a second conductive line connected to said second contact element, said first and second conductive lines extending along a substantially entire length of the interlocking connectors so as to have an end adjacent to or outwardly of a top end of the interlocking connectors;
- a means for passing a current to at least one of said first and second conductive lines; and
- a detection means connected to one of said first and second conductive lines, said detection means for ascertaining the existence of an electrical connection between said first and second contact elements.

11. The apparatus of claim 10, said first contact element affixed to the connector member, said second contact element affixed on the channel, said second contact element in contact with said first contact element when is received by the channel.

12. The apparatus of claim 11, the connector member being a T-shaped member, the channel formed in the interlocking connector of the adjacent panel, said T-shaped member slidably received within the channel.

13. The apparatus of claim 12, said first contact element affixed to an outer surface of said T-shaped member, said second contact element affixed to a surface of the channel.

14. The apparatus of claim 13, said first contact element being spring tensioned so as to extend away from said outer surface of said T-shaped member.

15. The apparatus of claim 10, said first conductive line being an insulated wire having one end connected to said first contact element and another end extending above a top surface of the panel, said second conductive line being an insulated wire having one end connected to said second contact element and another end extending above a top edge of the adjacent panel, said means for passing a current connected to at least one of the ends.

16. The apparatus of claim 11, said first conductive line integrally formed on the connector member, said second conductive line integrally formed in the channel.

17. The apparatus of claim 10, said detection means for measuring electrical resistance in one of said first and second conductive lines.

18. The apparatus of claim 10, said second conductive line having a plurality of additional contact elements extending therealong, each of said plurality of additional contact elements being in linear spaced relationship from an adjacent contact element.

* * * * *